(12) United States Patent
Beitelmal et al.

(10) Patent No.: US 7,682,234 B1
(45) Date of Patent: Mar. 23, 2010

(54) CORRELATION OF AIRFLOW DELIVERY DEVICES AND AIR MOVERS

(75) Inventors: Abdlmonem Beitelmal, Los Altos, CA (US); Cullen E. Bash, Los Gatos, CA (US); Chandrakant D. Patel, Fremont, CA (US); Ratnesh K. Sharma, Union City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1075 days.

(21) Appl. No.: 11/264,793

(22) Filed: Nov. 1, 2005

(51) Int. Cl.
*F24F 11/00* (2006.01)
*F24F 13/06* (2006.01)
*H05K 7/20* (2006.01)
*G05D 23/00* (2006.01)

(52) U.S. Cl. .................. 454/256; 454/184; 361/695; 700/276

(58) Field of Classification Search ............. 454/239, 454/254, 256, 184; 700/276; 361/695
See application file for complete search history.

(56) References Cited

U.S. PATENT DOCUMENTS

| | | | |
|---|---|---|---|
| 5,180,102 A * | 1/1993 | Gilbert et al. | 236/49.3 |
| 5,705,734 A * | 1/1998 | Ahmed | 73/1.35 |
| 6,574,104 B2 * | 6/2003 | Patel et al. | 361/695 |
| 6,694,759 B1 | 2/2004 | Bash et al. | |
| 6,747,872 B1 | 6/2004 | Patel et al. | |
| 2004/0186599 A1 * | 9/2004 | Ahmed et al. | 700/86 |
| 2005/0187664 A1 | 8/2005 | Bash et al. | |
| 2005/0267639 A1 * | 12/2005 | Sharma et al. | 700/276 |
| 2005/0270738 A1 * | 12/2005 | Hellriegel et al. | 361/687 |
| 2006/0047808 A1 * | 3/2006 | Sharma et al. | 709/224 |
| 2006/0075764 A1 * | 4/2006 | Bash et al. | 62/178 |
| 2006/0206291 A1 * | 9/2006 | Bash et al. | 702/194 |

* cited by examiner

*Primary Examiner*—Steven B McAllister
*Assistant Examiner*—Patrick F. O'Reilly, III

(57) ABSTRACT

In a method for correlating airflow delivery devices with air conditioning (AC) units having actuators for varying flow rates of air supplied by the air movers, flow rates of air supplied through the airflow delivery devices at a plurality of settings of the actuators are determined. Coefficients that relate the flow rates of air supplied by the air movers to the flow rates of air supplied through the airflow delivery devices based upon the flow rates determined at the plurality of actuator settings is calculated and the airflow delivery devices are correlated with the air movers using the calculated coefficients.

15 Claims, 6 Drawing Sheets

CORRELATION OF AIRFLOW DELIVERY DEVICES AND AIR MOVERS

BACKGROUND

A data center may be defined as a location, for instance, a room that houses computer systems arranged in a number of racks. A standard rack, for instance, an electronics cabinet, is defined as an Electronics Industry Association (EIA) enclosure, 78 in. (2 meters) wide, 24 in. (0.61 meter) wide and 30 in. (0.76 meter) deep. These racks are configured to house a number of computer systems, about forty (40) systems, with future configurations of racks being designed to accommodate 200 or more systems. The computer systems typically dissipate relatively significant amounts of heat during the operation of the respective components. For example, a typical computer system comprising multiple microprocessors may dissipate approximately 250 W of power. Thus, a rack containing forty (40) computer systems of this type may dissipate approximately 10 KW of power.

Data centers are typically equipped with a raised floor with vent tiles configured to provide cool air from air conditioning units to the computer systems from a pressurized plenum in the space below the raised floor. In certain instances, these vent tiles contain manually adjustable dampers for varying the flow rate of cool air therethrough. However, because these vent tiles cannot be remotely controlled, they are typically unable to vary the airflow to dynamically provision the data center with cooling resources. In addition, these vent tiles are typically manually actuated without knowledge of how each vent tile affects computer systems in its proximity. These actuations frequently have unintended consequences, such as, inadequate airflow delivery to the racks, adverse re-circulation of heated and cooled airflows, and wasted energy consumption. This may lead to inefficiencies in both cooling of the computer systems as well as in the operations of air conditioning units.

In other instances, automated vent tiles have been used in data centers to generally enable remote actuation of the vent tiles via feedback control algorithms. Conventional automated vent tiles are typically operated, however, without substantially accurate knowledge of how actuations of these vent tiles affect airflow in the data center.

SUMMARY OF THE INVENTION

A method for correlating airflow delivery devices with air movers having actuators for varying flow rates of air supplied by the air movers is disclosed herein. In the method, flow rates of air supplied through the airflow delivery devices at a plurality of settings of the actuators are determined. Coefficients that relate the flow rates of air supplied by the air movers to the flow rates of air supplied through the airflow delivery devices based upon the flow rates determined at the plurality of actuator settings is calculated and the airflow delivery devices are correlated with the air movers using the coefficients.

BRIEF DESCRIPTION OF THE DRAWINGS

Features of the present invention will become apparent to those skilled in the art from the following description with reference to the figures, in which.

DETAILED DESCRIPTION OF THE INVENTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

According to various examples, airflow delivery devices are commissioned to enable determinations of their relationships with air movers. More particularly, procedures and algorithms are described herein for evaluating the relationships between the airflow delivery devices and the air movers. The relationships may be determined through use of a coefficient that relates flow rates of airflow supplied through the airflow delivery devices with the flow rates of airflow supplied by the air movers. These relationships may be employed for the development of air mover control algorithms configured to, for instance, enable relatively efficient and dynamic provisioning of cooling resources.

The systems and methods for commissioning airflow delivery devices disclosed herein may be employed in any reasonably suitable environment containing actuators and sensors, such as, a building containing air conditioning units and sensors. In this regard, although particular reference is made throughout the present disclosure to a room containing air movers, it should be understood that the systems and methods disclosed herein may be implemented in other environments. In addition, therefore, the particular references to a room is for illustrative purposes and are not intended to limit the systems and methods disclosed herein solely to a room containing air movers.

Figure 1:
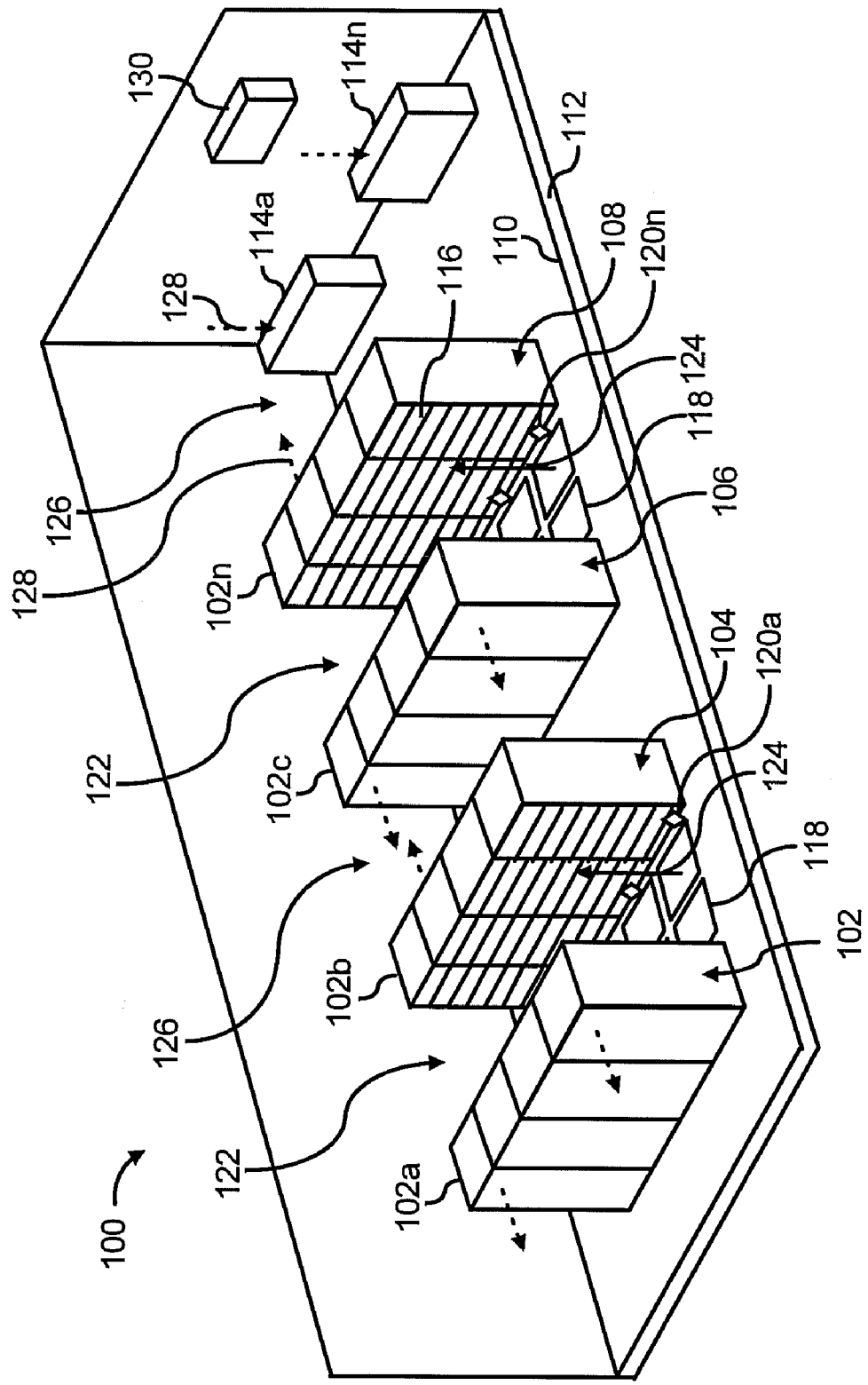
FIG. 1 shows a simplified perspective view of a room according to an embodiment of the invention.

With reference first to FIG. 1, there is shown a simplified perspective view of a section of a room 100, such as a data center, which may employ various examples of the invention. The terms "data center" are generally meant to denote a room or other space where one or more components capable of generating heat may be situated. In this respect, the terms "data center" are not meant to limit the invention to any specific type of room where data is communicated or processed, nor should it be construed that use of the terms "data center" limits the invention in any respect other than its definition herein above.

It should be readily apparent that the room 100 depicted in FIG. 1 represents a generalized illustration and that other components may be added or existing components may be removed or modified without departing from a scope of the room 100 described herein. For example, the room 100 may include any number of racks and various other components.

In addition, it should also be understood that heat generating/dissipating components may be located in the room 100 without being housed in racks.

The room 100 is depicted as having a plurality of racks 102a-102n, where "n" is an integer greater than one. The racks 102a-102n may comprise, for instance, electronics cabinets, aligned in parallel rows. Each of the rows 102-108 of racks 102a-102n is shown as containing four racks 102a-102n positioned on a raised floor 110. A plurality of wires and communication lines (not shown) may be located in a space 112 beneath the raised floor 110. The space 112 may also function as a plenum for delivery of air from one or more air movers 114a-114n, where "n" is an integer greater than one, to the racks 102a-102n. The air may be delivered from the space 112 to the racks 102a-102n through airflow delivery devices 118 located between some or all of the racks 102a-102n. The airflow delivery devices 118 are shown as being located between rows 102 and 104 and 106 and 108. In one example, the air movers 114a-114n may comprise air conditioning units configured to supply cooled airflow into the space 112. In another example, the air movers 114a-114n may comprise blowers or other suitable air moving apparatuses designed to increase the pressure of airflow contained in the space 112.

The air contained in the space 112 may include air supplied by one or more air movers 114a-114n. Thus, characteristics of the air, such as, temperature, pressure, flow rate, etc., at various locations in the space 112 may substantially be affected by one or more of the air movers 114a-114n. In this regard, characteristics of the air at various areas in the space 112 and the air supplied to the racks 102a-102n may vary, for instance, if the temperatures or the flow rates of the air supplied by these air movers 114a-114n due to mixing of the air. In other words, characteristics of the air supplied through the airflow delivery devices 118 may differ for various airflow delivery devices 118 due to the differences in the characteristics of the air at the various locations in the space 112.

In addition, differences in the characteristics of the air may be based upon various factors, including, the proximities of the air movers 114a-114n to the airflow delivery devices 118, obstacles in the space 112, airflow patterns in the room 100, etc. The air movers 114a-114n may thus have particular levels of influence over the airflow delivery devices 118 depending upon these various factors. By way of example, an air mover 114a may have a greater level of influence over an airflow delivery device 118 that is in relatively closer proximity to the air mover 114a than an airflow delivery device 118 that is relatively farther away from the air mover 114a.

The level of influence each of the air movers 114a-114n has over the airflow delivery devices 118 is considered an airflow delivery device weighted coefficient ("VTWC" or "α"). Generally speaking, the VTWC is employed to commission the airflow delivery devices 118 in the room 100 through an evaluation of the relationships between the air movers 114a-114n and the airflow delivery devices 118 in the room 100. In one respect, the VTWC or the dimensionless constant "α" may be employed in air mover 114a-114n control algorithms to relatively accurately control one or more characteristics of the airflow supplied through the airflow delivery devices 118.

The flow rate of air through an airflow delivery device 118 is directly related to the static pressure of the airflow below the airflow delivery device 118. The static pressure is also directly related to the total flow rate from all of the air movers 114a-114n from which the airflow is supplied below the airflow delivery device 118. The flow rate through the airflow delivery device 118 is influenced by the flow rates of air supplied by the air movers 114a-114n. Therefore, the flow rate through an airflow delivery device 118 is directly influenced by the flow rate from all of the air movers 114a-114n that affect the static pressure in the space 112. It may thus be assumed that the air flow through an airflow delivery device 118 is directly proportional to the sum of the air flow rates from all of the air movers 114a-114n. This relationship may be illustrated through the following equation:

$$\dot{V}_j = \alpha_{j1}\dot{Q}_1 + \alpha_{j2}\dot{Q}_2 + \ldots + \alpha_{jn}\dot{Q}_n. \quad \text{Equation (1)}$$

In Equation (1), $\dot{V}_j$ is the flow rate from airflow delivery device (j), $\alpha_{ji}$ is a dimensionless constant relating to a unique combination of airflow delivery device (j) and air mover (i), and $\dot{Q}_i$ is the flow rate of air mover (i). In addition, Equation (1) may be rewritten as:

Equation (2):

$$\dot{V}_j = \sum_{i=1}^{n} \alpha_{ji}\dot{Q}_i,$$

or for a set of airflow delivery devices, Equation (2) may be written as a (m×n) linear system of equations in a matrix form as:

$$[\dot{V}_j] = [\alpha_{ji}][\dot{Q}_i], \quad \text{Equation (3)}$$

with the condition that for the same settings of the air movers (i), we have:

Equation (4):

$$\sum_{j=1}^{m} \alpha_{ji} = 1,$$

for any air mover (i).

By way of example, if a room 100 includes ten (10) airflow delivery devices 118 and three (3) air movers 114a-114c, for a first airflow delivery device 118, Equation (1) may be written as:

$$\dot{V}_1 = \alpha_{11}\dot{Q}_1 + \alpha_{12}\dot{Q}_2 + \alpha_{13}\dot{Q}_3. \quad \text{Equation (5)}$$

For the entire system of airflow delivery devices 118 and air movers 114a-114c, Equation 1 may be written as:

$$\dot{V}_j = \alpha_{j1}\dot{Q}_1 + \alpha_{j2}\dot{Q}_2 + \alpha_{j3}\dot{Q}_3, \quad \text{Equation (6)}$$

which may also be written in matrix form as shown in Equation (3), or:

$$\begin{bmatrix} \dot{V}_1 \\ \dot{V}_2 \\ \dot{V}_3 \\ \dot{V}_4 \\ \dot{V}_5 \\ \dot{V}_6 \\ \dot{V}_7 \\ \dot{V}_8 \\ \dot{V}_9 \\ \dot{V}_{10} \end{bmatrix} = \begin{bmatrix} \alpha_{11} & \alpha_{12} & \alpha_{13} \\ \alpha_{21} & \alpha_{22} & \alpha_{23} \\ \alpha_{31} & \alpha_{32} & \alpha_{33} \\ \alpha_{41} & \alpha_{42} & \alpha_{43} \\ \alpha_{51} & \alpha_{52} & \alpha_{53} \\ \alpha_{61} & \alpha_{62} & \alpha_{63} \\ \alpha_{71} & \alpha_{72} & \alpha_{73} \\ \alpha_{81} & \alpha_{82} & \alpha_{83} \\ \alpha_{91} & \alpha_{92} & \alpha_{93} \\ \alpha_{101} & \alpha_{102} & \alpha_{103} \end{bmatrix} \begin{bmatrix} \dot{Q}_1 \\ \dot{Q}_2 \\ \dot{Q}_3 \end{bmatrix} \quad \text{Equation (7)}$$

For air movers 114a-114n that are located relatively far away from the airflow delivery device 118, the airflow delivery device 118 may only experience the collective static pressure resulting from all of the air movers 114a-114n that affect the static pressure. Accordingly, the dimensionless constants "α" for the air movers 114a-114n may be reduced to a single average coefficient ($\alpha_{Average}$) for the total flow rates of all of the air movers 114a-114n that feed airflow into the space 112. In other words, Equation (1) may be reduced to:

$$\dot{V}_j = \alpha_{Average}[\dot{Q}_1 + \dot{Q}_2 + \ldots + \dot{Q}_n] = \alpha_{Average} \sum_{i=1}^{n} (\dot{Q}_i). \quad \text{Equation (8)}$$

In addition, the dimensionless constant ($\alpha_{31}$) for each of the airflow delivery devices 118 may be obtained for each set of measurements (described below with respect to FIGS. 4A and 4B) through:

$$\alpha_{ji} = \frac{\dot{V}_j}{\sum_{i=1}^{n} (\dot{Q}_i)}. \quad \text{Equation (9)}$$

For all of the air mover 114a-114n measurement sets, the average dimensionless constant ($\alpha_{Average}$) may be determined through:

$$\alpha_{Average} = \frac{1}{N} \sum_{i=1}^{N} \alpha_{ji}, \quad \text{Equation (10)}$$

where N is the total number of dimensionless constants ($\alpha_{ji}$) calculated from the measurement sets.

As described in greater detail herein below, sets of measurements may be obtained to determine the level of influence each of the air movers 114a-114n has on the airflow delivery devices 118, which may be determined through any of Equations (3), (8), and (10). In obtaining these sets of measurements, at least one condition, for instance, temperature, pressure, or humidity, of the air supplied to various areas of the room 100 may be detected by sensors 120a-120n designed to detect the at least one condition, where "n" is an integer greater than one. As shown, the sensors 120a-120n are represented as diamonds to distinguish them from other elements depicted in FIG. 1. In addition, the sensors 120a-120n are depicted as being positioned to detect the at least one condition at the inlets of the racks 102a-102n. In this example, the sensors 120a-120n may comprise temperature sensors or absolute humidity sensors. In another example, the sensors 120a-120n may be positioned within the space 112 near respective airflow delivery devices 118 to detect the temperature, pressure, or humidity of the cooled air supplied through the respective airflow delivery devices 118. As will be described in greater detail herein below, the sensors 120a-120n may be employed to detect the at least one condition at various air mover 114a-114n settings.

The airflow delivery devices 118 may comprise manually or remotely adjustable airflow delivery devices. In this regard, the airflow delivery devices 118 may be manipulated to vary, for instance, the mass flow rates of cooled air supplied to the racks 102a-102n. In addition, the airflow delivery devices 118 may comprise the dynamically controllable vent tiles disclosed and described in commonly assigned U.S. Pat. No. 6,574,104, the disclosure of which is hereby incorporated by reference in its entirety. As described in the U.S. Pat. No. 6,574,104, the vent tiles are termed "dynamically controllable" because they generally operate to control at least one of velocity, volume flow rate and direction of the airflow therethrough. In addition, specific examples of dynamically controllable airflow delivery devices 118 may be found in U.S. Pat. No. 6,694,759, filed on Jan. 27, 2003, which is assigned to the assignee of the present invention and is incorporated by reference herein in its entirety.

The racks 102a-102n are generally configured to house a plurality of components 116 capable of generating/dissipating heat, for instance, processors, micro-controllers, high-speed video cards, memories, semi-conductor devices, and the like. The components 116 may be elements of a plurality of subsystems (not shown), for instance, computers, servers, bladed servers, etc. The subsystems and the components may be operated to perform various electronic functions, for instance, computing, switching, routing, displaying, and the like.

The areas between the rows 102 and 104 and between the rows 106 and 108 may comprise cool aisles 122. These aisles are considered "cool aisles" because they are configured to receive airflow from the airflow delivery devices 118, as generally indicated by the arrows 124. In addition, and as shown, the racks 102a-102n generally receive air from the cool aisles 122. The aisles between the rows 104 and 106, and on the rear sides of rows 102 and 108, are considered hot aisles 126. These aisles are considered "hot aisles" because they are positioned to receive air that has been heated by the components 116 in the racks 102a-102n, as indicated by the arrows 128.

The sides of the racks 102a-102n that face the cool aisles 122 may be considered as the fronts of the racks 102a-102n and the sides of the racks 102a-102n that face away from the cool aisles 122 may be considered as the rears of the racks 102a-102n. For purposes of simplicity and not of limitation, this nomenclature will be relied upon throughout the present disclosure to describe the various sides of the racks 102a-102n.

Although not shown, some or all of the racks 102a-102n may be positioned to each face the same direction, such that there are no distinct "hot aisles" and "cool aisles". Additionally, some or all of the racks 102a-102n may be positioned with their rear sides adjacent to one another. In this example, the airflow delivery devices 118 may be provided in each aisle 122 and 126. In addition, the racks 102a-102n may comprise outlets on top panels thereof to enable heated air to flow out of the racks 102a-102n.

As described herein above, the air movers 114a-114n generally operate to cool received heated air, as indicated by the arrows 128. In addition, the air movers 114a-114n may supply the racks 102a-102n with airflow that has been cooled, through any reasonably suitable known manner and may thus comprise widely available, conventional air movers. For instance, the air movers 114a-114n may comprise vapor-compression type air conditioning units, chiller type air conditioning units, etc. Examples of suitable air movers 114a-114n may be found in co-pending and commonly assigned U.S. patent application Ser. No. 10/853,529, filed on May 26, 2004, and entitled "Energy Efficient air mover Operation," the disclosure of which is hereby incorporated by reference in its entirety.

Also shown in FIG. 1 is a controller 130 configured to perform various functions in the room 100. As described in greater detail herein below, the controller 130 may receive data from the air movers 114a-114n and the sensors 120a-120n and may perform various computations on the data. Although the controller 130 is illustrated in FIG. 1 as comprising a component separate from the components 116 housed in the racks 102a-102n, the controller 130 may comprise one or more of the components 116 without departing from a scope of the room 100 disclosed herein. In addition, or alternatively, the controller 130 may comprise software configured to operate on a computing device, for instance, one of the components 116.

The room 100 is illustrated in FIG. 1 as containing four rows 102-108 of racks 102a-102n and two air movers 114a-114n for purposes of simplicity and illustration. Thus, the room 100 should not be construed as being limited in any respect to the number of racks 102a-102n and air movers 114a-114n illustrated in FIG. 1. In addition, although the racks 102a-102n have all been illustrated similarly, the racks 102a-102n may comprise heterogeneous configurations. For instance, the racks 102a-102n may be manufactured by different companies or the racks 102a-102n may be designed to house differing types of components 116, for example, horizontally mounted servers, bladed servers, etc.

Figure 2:
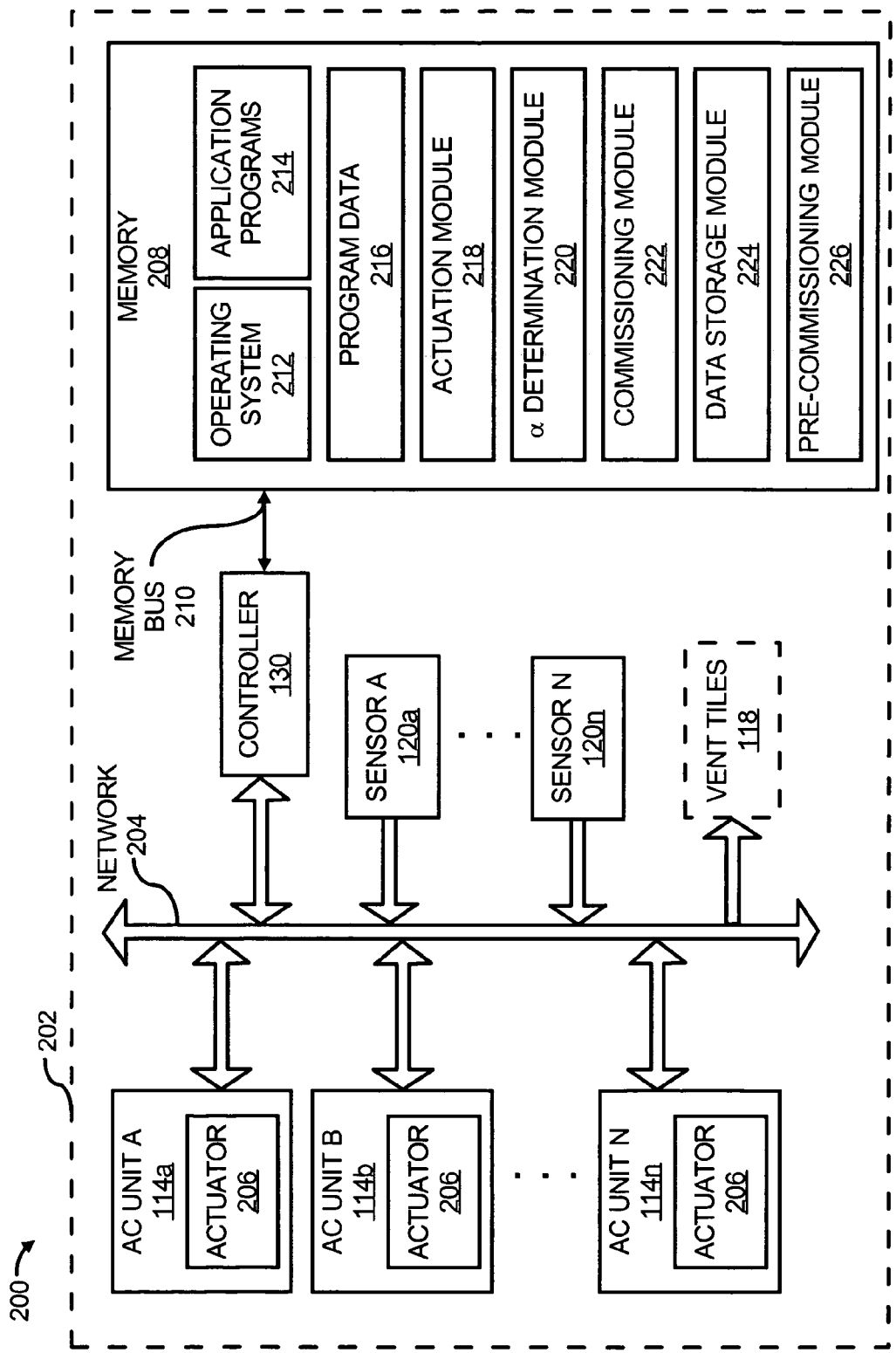
FIG. 2 is a block diagram of an airflow delivery device to air mover correlation system according to an embodiment of the invention.

FIG. 2 is a block diagram 200 of an airflow delivery device to air mover correlation system 202. It should be understood that the following description of the block diagram 200 is but one manner of a variety of different manners in which such a correlation system 202 may be operated. In addition, it should be understood that the correlation system 202 may include additional components and that some of the components described may be removed and/or modified without departing from a scope of the correlation system 202.

As shown, the correlation system 202 includes the controller 130 depicted in FIG. 1. As described hereinabove, the controller 130 is configured to perform various functions in the room 100. In this regard, the controller 130 may comprise a computing device, for instance, a computer system, a server, etc. In addition, the controller 130 may comprise a microprocessor, a micro-controller, an application specific integrated circuit (ASIC), and the like, configured to perform various processing functions. In addition, or alternatively, the controller 130 may comprise software operating in any of a number of computing devices.

The controller 130 is configured to communicate with the air movers 114a-114n through a network 204. Although not shown, the controller 130 may be equipped with or have access to software and/or hardware to enable the controller 130 to transmit and receive data over the network 204. The network 204 generally represents a wired or wireless structure in the room 100 for the transmission of data between the various components of the correlation system 202. The network 204 may comprise an existing network infrastructure or it may comprise a separate network configuration installed for the purpose of correlating airflow delivery devices 118 and air movers 114a-114n by the controller 130.

The controller 130 is also configured to receive data from the sensors 120a-120n over the network 204. As stated above, the sensors 120a-120n may comprise sensors configured to detect at least one environmental condition at various locations in the room 100. The at least one environmental condition may comprise temperature, absolute humidity, or pressure. In addition, the controller 130 may store the data collected from the sensors 120a-120n and may employ the data to correlate the airflow delivery devices 118 and the air movers 114a-114n as described in greater detail herein below.

In one regard, the controller 130 may transmit instructions over the network 204 to the air movers 114a-114n to vary operations of the air movers 114a-114n. More particularly, the controller 130 may transmit instructions to the air movers 114a-114n to vary operations of respective actuators 206 configured to vary the flow rates of airflow supplied by the air movers 114a-114n. In this regard, the actuators 206 may comprise blowers, fans, variable frequency drives (VFD), etc. Generally speaking, VFDs comprise actuators configured to vary the speeds at which the fans or blowers operate to thereby control the airflow volume supplied by the air movers 114a-114n.

The controller 130 may also optionally transmit instructions to the airflow delivery devices 118 to vary the percentages at which the airflow delivery devices 118 are open and thereby vary the airflow through the airflow delivery devices 118. The transmission of instructions to the airflow delivery devices 118 may be optional because the airflow delivery devices 118 may be separately controllable or manually adjustable.

The controller 130 is further illustrated as being in communication with a memory 208 through, for instance, a memory bus 210. However, in certain instances, the memory 208 may form part of the controller 130 without departing from a scope of the correlation system 202. Generally speaking, the memory 208 may be configured to provide storage of software, algorithms, and the like, that provide the functionality of the controller 130. By way of example, the memory 208 may store an operating system 212, application programs 214, program data 216, and the like. In this regard, the memory 208 may be implemented as a combination of volatile and non-volatile memory, such as DRAM, EEPROM, MRAM, flash memory, and the like. In addition, or alternatively, the memory 208 may comprise a device configured to read from and write to a removable media, such as, a floppy disk, a CD-ROM, a DVD-ROM, or other optical or magnetic media.

The memory 208 may also store an actuation module 218, which the controller 130 may implement to perform various functions with respect to correlating the airflow delivery devices 118 with the air movers 114a-114n. More particularly, for instance, the actuation module 218 may be implemented to control how each of the air mover 114a-114n actuators 206 are controlled during the correlation process. The memory 208 may further store a VTWC ($\alpha$) determination module, a commissioning module 222, a data storage module 224, and an optional pre-commissioning module. The pre-commissioning module 226 is considered as being optional because the airflow delivery devices 118 may be correlated with the air movers 114a-114n in many instances without implementation of the pre-commissioning module 226.

Figure 3:
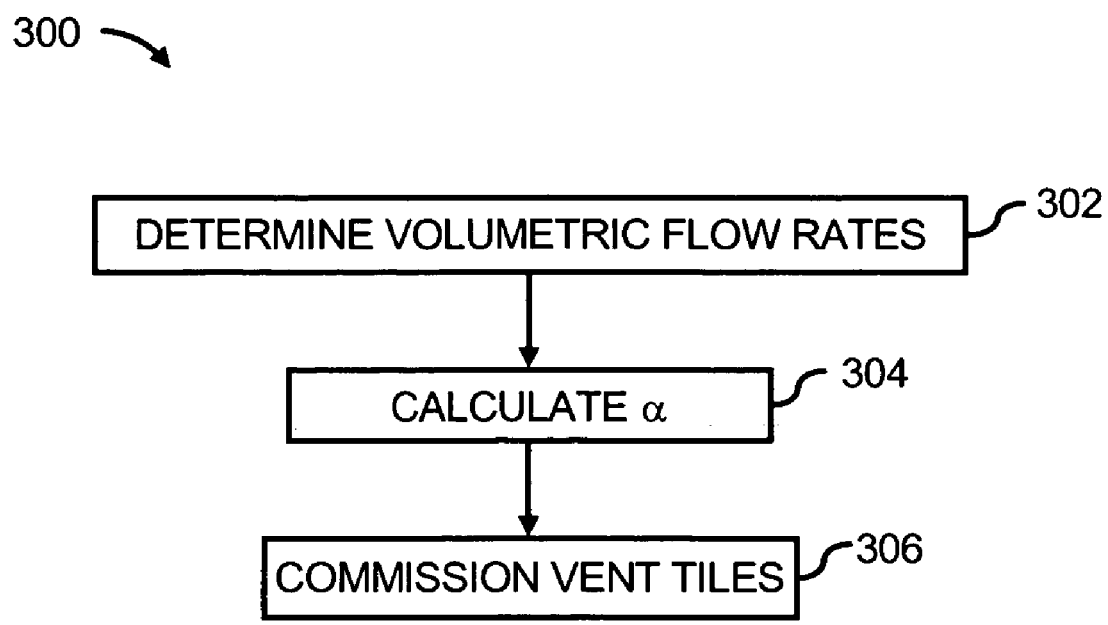
FIG. 3 illustrates a flow diagram of a method for correlating airflow delivery devices with air movers, according to an embodiment of the invention.
Figure 4A:
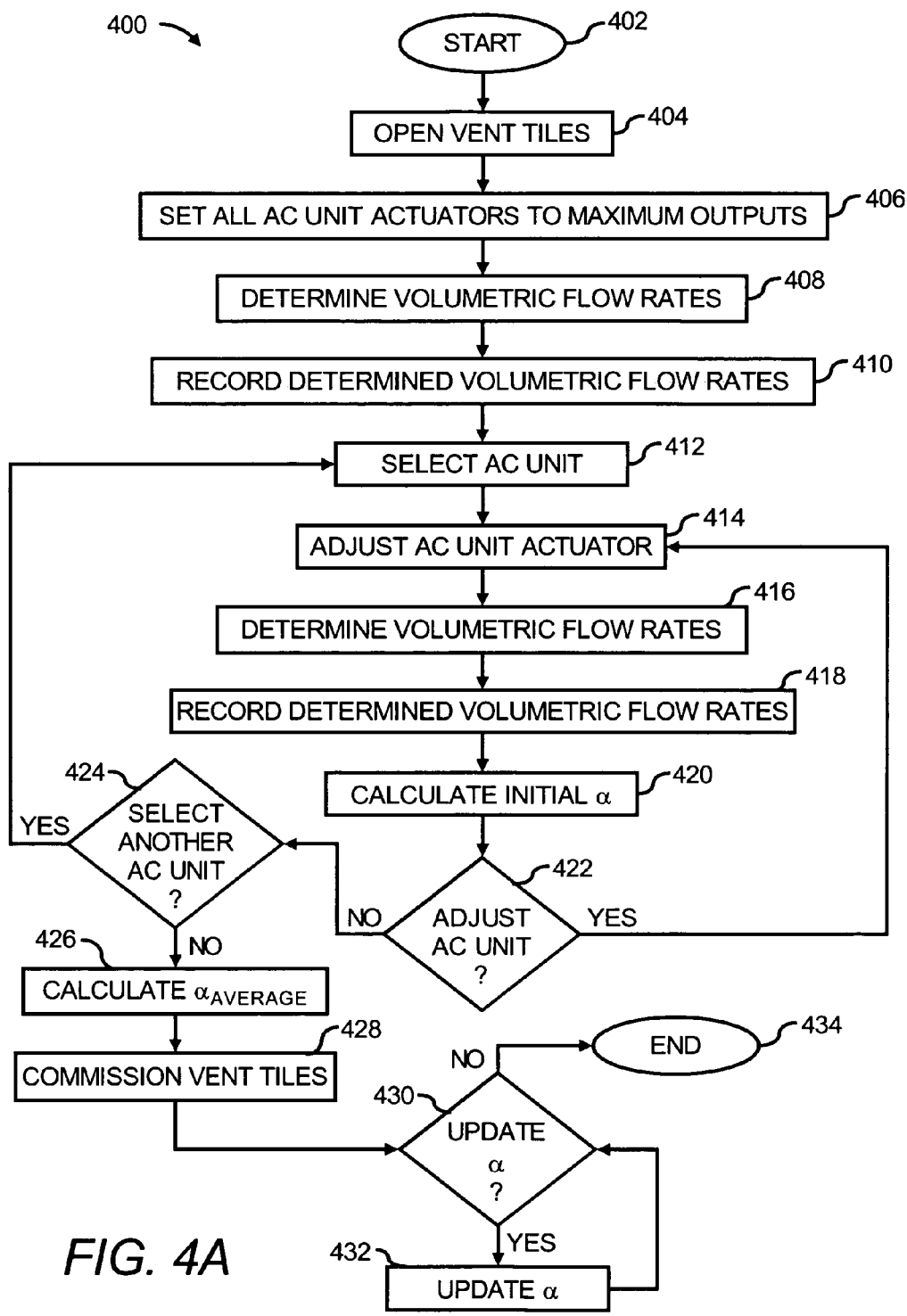
FIG. 4A shows a flow diagram for correlating airflow delivery devices with air movers, which depicts the steps in the flow diagram of FIG. 3 in greater detail.
Figure 4B:
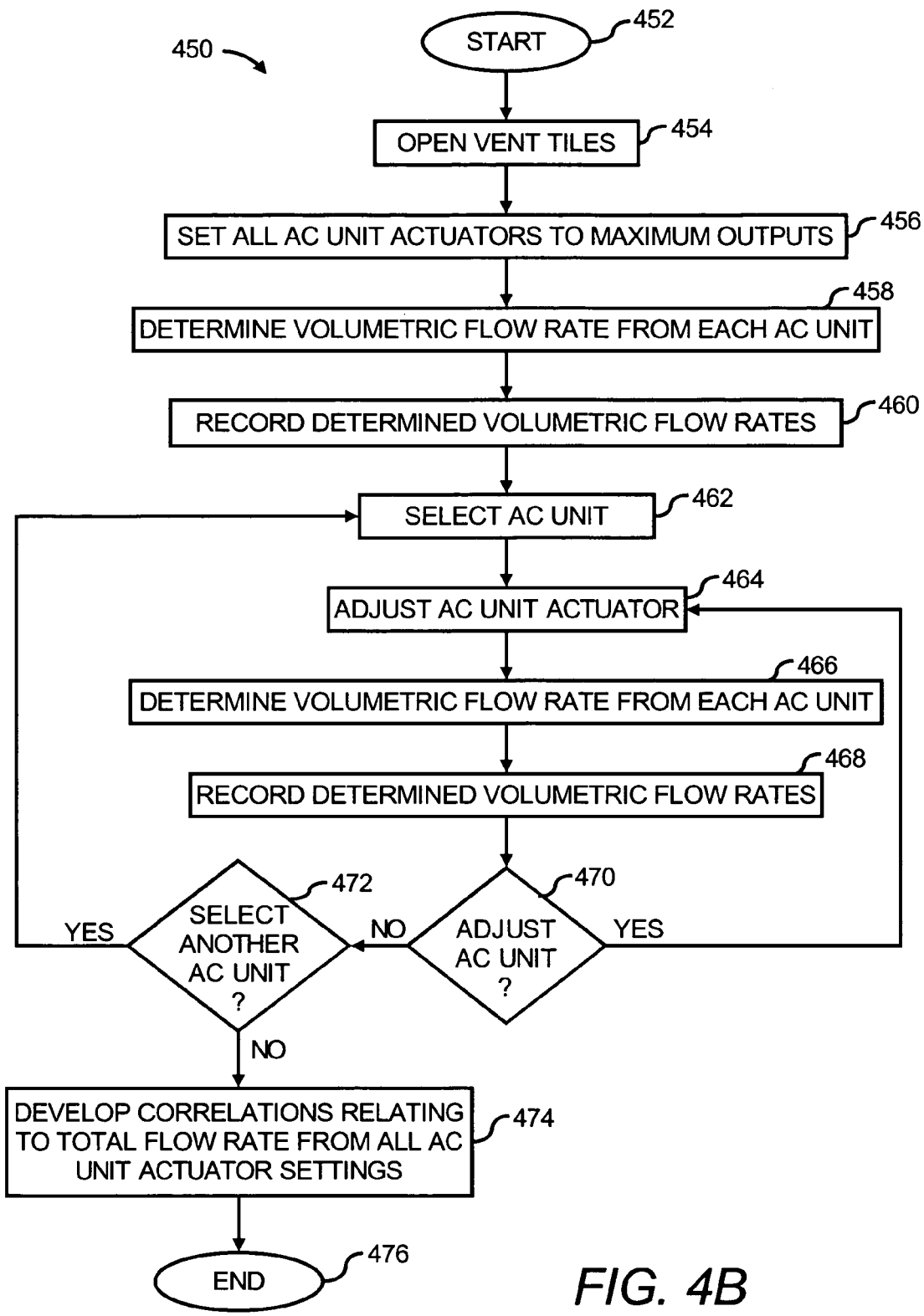
FIG. 4B shows a flow diagram of a method for pre-commissioning the air movers, according to an embodiment of the invention.

Various manners in which the correlation system 202 may be implemented are described in greater detail with respect to FIGS. 3, 4A, and 4B.

FIG. 3 illustrates a flow diagram of a method 300 for correlating airflow delivery devices 118 with air movers 114a-114n, according to an example. It is to be understood that the following description of the method 300 is but one manner of a variety of different manners in which an example of the invention may be practiced. It should also be apparent to those of ordinary skill in the art that the method 300 represents a generalized illustration and that other steps may be added or existing steps may be removed, modified or rearranged without departing from a scope of the method 300.

The description of the method 300 is made with reference to the block diagram 200 illustrated in FIG. 2, and thus makes reference to the elements cited therein. It should, however, be understood that the method 300 is not limited to the elements set forth in the block diagram 200. Instead, it should be understood that the method 300 may be practiced by a system having a different configuration than that set forth in the block diagram 200.

The method 300 may be implemented to commission the airflow delivery devices 118 with respect to the air movers 114a-114n. More particularly, the method 300 may be implemented to correlate the air movers 114a-114n, such that the amount of influence a particular air mover 114a-114n has over a particular airflow delivery device 118 may be determined with a relatively high level of accuracy. In one regard, the level of influence may be employed in schemes to control the air movers 114a-114n in supplying the airflow delivery devices 118, and subsequently the components 116, with airflow having desired characteristics.

In the method 300, the controller 130 may determine flow rates of air supplied through the airflow delivery devices 118 at a plurality of settings of the air mover 114a-114n actuators 206 at step 302. At step 304, the controller 130 may calculate coefficients ($\alpha_{ji}$) that relate the flow rates of air supplied by the air movers 114a-114n to the flow rates of air supplied through the airflow delivery devices 118 based upon the flow rates determined at the plurality of actuator 206 settings. The coefficients ($\alpha_{ji}$) may be calculated through Equations (3) or (10) as described in greater detail herein above. In addition, the controller 130 may correlate the airflow delivery devices 118 with the air movers 114a-114n using the calculated coefficients at step 306.

With respect to a first example where Equation (3) is implemented to calculate the coefficients ($\alpha_{ji}$), the correlations between the airflow delivery devices 118 and the air movers 114a-114n may be determined through the matrix form of Equation (3) as described above. In addition, the step 302 of determining flow rates, in this example, may include steps 404-418 described herein below with respect to FIG. 4A. It should thus be understood that some or all of the steps outlined in FIG. 4A may also be applicable to this first example of the method 300.

A more detailed description of the steps involved in accordance with a second example of the method 300 where an average coefficient is used to commission the airflow delivery devices 118 is provided below with respect to the method 400 depicted in FIG. 4A.

With particular reference now to FIG. 4A, there is shown a flow diagram of a method 400 for correlating airflow delivery devices 118 with air movers 114. It is to be understood that the following description of the method 400 is but one manner of a variety of different manners in which an embodiment of the invention may be practiced. It should also be apparent to those of ordinary skill in the art that the method 400 represents a generalized illustration and that other steps may be added or existing steps may be removed, modified or rearranged without departing from a scope of the method 400.

The method 400 may be implemented to commission the airflow delivery devices 118 with respect to air movers 114a-114n in a room 100. More particularly, the method 400 may be implemented to correlate the airflow delivery devices 118 to the air movers 114a-114n. The airflow delivery devices 118 may be correlated to the air movers 114a-114n to enable an understanding of how the air movers 114a-114n influence the airflow delivery devices 118. Thus, for instance, if it is desired to increase the supply of airflow through a particular airflow delivery device 118, the relationship determined through implementation of the method 400 may enable an accurate increase in the airflow supply through manipulation of the appropriate one or more air movers 114a-114n. In this regard, the amount of energy required to relatively accurately supply desired levels of airflow through the airflow delivery devices 118 may substantially be optimized.

The description of the method 400 is made with reference to the block diagram 200 illustrated in FIG. 2, and thus makes reference to the elements cited therein. It should, however, be understood that the method 400 is not limited to the elements set forth in the block diagram 200. Instead, it should be understood that the method 400 may be practiced by a system having a different configuration than that set forth in the block diagram 200.

The method 400 may be initiated at step 402 in response to any of a number of stimuli or conditions. For instance, the method 400 may be initiated with activation of the components in the room 100, such as, the air movers 114a-114n, components 116, etc. In addition, or alternatively, the method 400 may be manually initiated or the controller 130 may be programmed to initiate the method 400 at various times, for a set duration of time, substantially continuously, etc.

Once initiated, the airflow delivery devices 118 may be opened to 100% at step 404. For instance, the controller 130 may open the airflow delivery devices 118 if the airflow delivery devices 118 are controlled by the controller 130. Alternatively, the airflow delivery devices 118 may be opened by one or more other controllers or the airflow delivery devices 118 may be manually opened.

At step 406, the actuators 206 of the air movers 114a-114n are set to their maximum outputs. The flow rates of airflow supplied from each of the air movers 114a-114n and the flow rates of airflow supplied from each of the airflow delivery devices 118 are determined at step 408. In addition, the determined flow rates are recorded at step 410. Operations of the actuators 206 may be controlled by the controller 130 through implementation of the actuation module 218. In addition, the flow rates of airflow supplied by the air movers 114a-114n and the airflow delivery devices 118 may be measured directly by the sensors 120a-120n or they may be estimated based upon measurements obtained by the sensors 120a-120n. In any regard, the determined flow rates may be stored in the data storage module 224.

In addition, a period of time may be allowed to elapse following step 406 and prior to determining the flow rates of airflow supplied by the air movers 114a-114n and the airflow delivery devices 118 at step 408. This time period may be allowed to elapse in order to enable a relatively steady-state of operation to be reached. The time period may be based upon, for instance, the loading on the air movers 114a-114n. In addition, during the time period between steps 406 and 408, median flow rate determinations may be made for one or more of the air movers 114a-114n and the airflow delivery devices 118 in the event that the flow rates oscillate during the time period. In this case, the flow rate determinations recorded at step 410 may comprise time-averaged values.

At step 412, one of the air movers 114a-114n may be selected for adjustment. The air mover 114a-114n may be selected randomly or based upon a predetermined order. The actuator 206 of the selected air mover 114a is adjusted at step 414. More particularly, the actuator 206 of the selected air mover 114a may be reduced by a predetermined amount, for instance, 10%, 25%, etc. In addition, at step 416, the flow rates of airflow supplied from each of the air movers 114a-114n and the flow rates of airflow supplied from each of the airflow delivery devices 118 are determined in manners similar to those described above with respect to step 408. The determined flow rates are also recorded at step 418.

In addition, a period of time may be allowed to elapse following step 414 and prior to determining the flow rates of airflow supplied by the air movers 114a-114n and the airflow delivery devices 118 at step 416. This time period may be allowed to elapse in order to enable a relatively steady-state of operation to be reached. The time period may be based upon, for instance, the loading on the air movers 114a-114n. In addition, during the time period between steps 414 and 416, median flow rate determinations may be made for one or more of the air movers 114a-114n and the airflow delivery devices 118 in the event that the flow rates oscillate during the time period. In this case, the flow rate determinations recorded at step 418 may comprise time-averaged values.

At step 420, an initial VTWC or dimensionless constant "α" may be calculated, for instance, through implementation of the α determination module 220. More particularly, the α for a particular airflow delivery device (j) may be determined through Equation (9), which is reproduced below:

$$\alpha_{ji} = \frac{\dot{V}_j}{\sum_{i=1}^{n}(\dot{Q}_i)}. \qquad \text{Equation (9)}$$

As shown in Equation (9), the VTWC (α) for the airflow delivery device (j) is based upon the flow rate through the airflow delivery device (j) divided by the sum of the flow rates of all of the air movers (i). The VTWC (α) for each of the airflow delivery devices 118 may be calculated at step 420 and these values may be stored in the data storage module 224.

At step 422, it may be determined as to whether the air mover selected at step 412 is to be adjusted further. If the selected air mover is to be adjusted further, steps 414-420 may be repeated such that the VTWC (α) for each of the airflow delivery devices 118 may be calculated at the adjusted air mover level. In addition, the selected air mover may be adjusted further if the actuator 206 of the selected air mover has not been adjusted to a minimum level. Thus, for instance, steps 414-422 may be repeated such that the actuator 206 of the selected air mover is reduced incrementally until the actuator 206 has been reduced to the minimum level, for instance, 0%.

When a "no" condition is reached at step 422, it may be determined as to whether another air mover is to be selected at step 424. A determination to select another air mover may be made if flow rate measurements and VTWC calculations have been made for less than all of the desired number of air movers 114a-114n. If it is determined that another air mover 114b is to be selected, another air mover 114b may be selected at step 412. In addition, the actuator 206 of the selected air mover 114b may be adjusted at step 414 and steps 416-422 may be repeated as described above with respect to the air mover 114a to obtain a set of measurements VTWC (α) at the various air mover 114b actuator 206 settings.

If, at step 424, it is determined that another air mover is not to be selected, the average VTWC (α) may be calculated at step 426. More particularly, the controller 130 may implement the α determination module 220 to calculate the average value for VTWC (α) based upon the initial VTWC (α) values calculated at step 420 for the various air mover 114a-114n settings. In addition, the average VTWC (α) value may be calculated based upon Equation (10), which is reproduced below:

$$\alpha_{Average} = \frac{1}{N}\sum_{i=1}^{N}\alpha_{ji}. \qquad \text{Equation (10)}$$

As described herein above with respect to FIG. 1, the average VTWC (α) calculated through Equation (10) may be employed in Equation (8), which is reproduced below, to commission the airflow delivery devices 118 at step 428.

$$\dot{V}_j = \alpha_{Average}[\dot{Q}_1 + \dot{Q}_2 + \ldots + \dot{Q}_n] = \alpha_{Average}\sum_{i=1}^{n}(\dot{Q}_i). \qquad \text{Equation (8)}$$

As shown by Equation (8), the flow rate through a particular airflow delivery device (j) may be considered as being equivalent to the average VTWC (α) times the sum of the flow rates of airflow supplied by the air movers 114a-114n. The controller 130 may commission the airflow delivery devices 118 through implementation of the commissioning module 222. In other words, the controller 130 may determine correlations between the air movers 114a-114n and the airflow delivery devices 118 at step 428 through the commissioning process described above. In addition, the correlations between the air movers 114a-114n and the airflow delivery devices 118 may be stored in the data storage module 224.

At step 430, it may be determined as to whether the VTWC (α) value determined at step 426 is to be updated. A determination to update the VTWC (α) may be made in order to ensure that the correlations between the air movers 114a-114n remain relatively accurate as conditions may change in the room 100. In addition, if it is determined that the VTWC (α) is to be updated at step 430, the VTWC (α) may be updated at step 432. More particularly, for instance, the VTWC (α) may be updated by performing some or all of steps 404-428. The VTWC (α) may be continuously updated or at various time intervals. Also, if it is determined that the VTWC (α) is not to be updated, the method 400 may end as indicated at step 434.

Turning now to FIG. 4B, there is shown a flow diagram of a method 450 for pre-commissioning the air movers 114a-114n. It is to be understood that the following description of the method 450 is but one manner of a variety of different manners in which an embodiment of the invention may be practiced. It should also be apparent to those of ordinary skill in the art that the method 450 represents a generalized illustration and that other steps may be added or existing steps may be removed, modified or rearranged without departing from a scope of the method 450.

The method 450 may be performed to determine the flow rates of air supplied by the air movers 114a-114n at various settings of the air movers 114a-114n. In other words, because there may be variability among the air movers 114a-114n, the method 450 may be performed to enable determination of a substantially accurate correlation between changes in air mover 114a-114n settings and the flow rates of air supplied by the air movers 114a-114n at the various settings. In one regard, this correlation may be employed in either of the methods 300 and 400 for correlating the airflow delivery devices 118 and air movers 114a-114n. More particularly, for instance, this correlation may be used to yield the flow rates of the air movers 114a-114n at steps 302, 408, and 416 instead of requiring that the flow rates of airflow supplied by the air movers 114a-114n be measured or estimated again at steps 302, 408, and 416.

The method 450 may be initiated at step 452 in response to any of a number of stimuli or conditions as described above with respect to step 402. In addition, the airflow delivery devices 118 may be opened to 100% at step 454, as described above with respect to step 404. In any regard, the method 450 may be performed by the controller 130 through implementation of the pre-commissioning module 226.

At step 456, the actuators 206 of the air movers 114a-114n may be set to their maximum speeds as described above with respect to step 406. The flow rates of airflow supplied from each of the air movers 114a-114n may be determined at step 458. That is, the flow rates of airflow may be measured directly or estimated based upon one or more measurements. In one regard, the flow rates may be measured or estimated at locations near the returns of the air movers 114a-114n. In addition, the determined flow rates are recorded at step 460. A period of time may be allowed to elapse following step 456 and prior to determining the flow rates of airflow supplied by the air movers 114a-114n at step 458. In addition, during the time period between steps 456 and 458, median flow rate determinations may be made for one or more of the air movers 114a-114n and the airflow delivery devices 118 in the event that the flow rates oscillate during the time period. In this case, the flow rate determinations recorded at step 460 may comprise time-averaged values.

At step 462, one of the air movers 114a-114n may be selected for adjustment as described above with respect to step 412. The actuator 206 of the selected air mover 114a may be adjusted at step 464 and the flow rates of airflow supplied from each of the air movers 114a-114n may be determined in manners similar to those described above with respect to step 458. The determined flow rates are also recorded at step 468. In addition, a period of time may be allowed to elapse following step 464 and prior to determining the flow rates of airflow supplied by the air movers 114a-114n at step 466.

At step 470, it may be determined as to whether the air mover selected at step 462 is to be adjusted further. If the selected air mover is to be adjusted further, steps 464-470 may be repeated such that the flow rates of airflow supplied by the air movers 114a-114n may be determined at a number of adjusted air mover 114a-114n levels. In addition, the selected air mover 114a may be adjusted further if the actuator 206 of the selected air mover 114a has not been adjusted to a minimum level. Thus, for instance, steps 464-470 may be repeated such that the actuator 206 of the selected air mover 114a is reduced incrementally until the actuator 206 has been reduced to the minimum level, for instance, 0%.

When a "no" condition is reached at step 470, it may be determined as to whether another air mover 114b is to be selected at step 472. A determination to select another air mover 114b may be made if flow rate measurements have been made for less than all of the desired number of air movers 114a-114n. If it is determined that another air mover 114b is to be selected, another air mover 114b may be selected at step 462. In addition, the actuator 206 of the selected air mover 114b may be adjusted at step 464 and steps 466-472 may be repeated as described above with respect to the air mover 114a to obtain flow rates at the various air mover 114b actuator 206 settings.

If, at step 472, it is determined that another air mover 114n is not to be selected, correlations relating to the total flow rate from the air movers 114a-114n at the various actuator 206 settings may be developed at step 474. This correlation may establish a manner in which the total flow from the air movers 114a-114n $$\left(\sum_{i=1}^{n} \dot{Q}_i\right)$$

may be calculated based upon the air mover 114a-114n actuator 206 settings. Following step 474, the method 450 may end as indicated at step 476.

The operations set forth in the methods 300, 400, and 450 may be contained as a utility, program, or subprogram, in any desired computer accessible medium. In addition, the methods 300, 400, and 450 may be embodied by a computer program, which can exist in a variety of forms both active and inactive. For example, it can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 5:
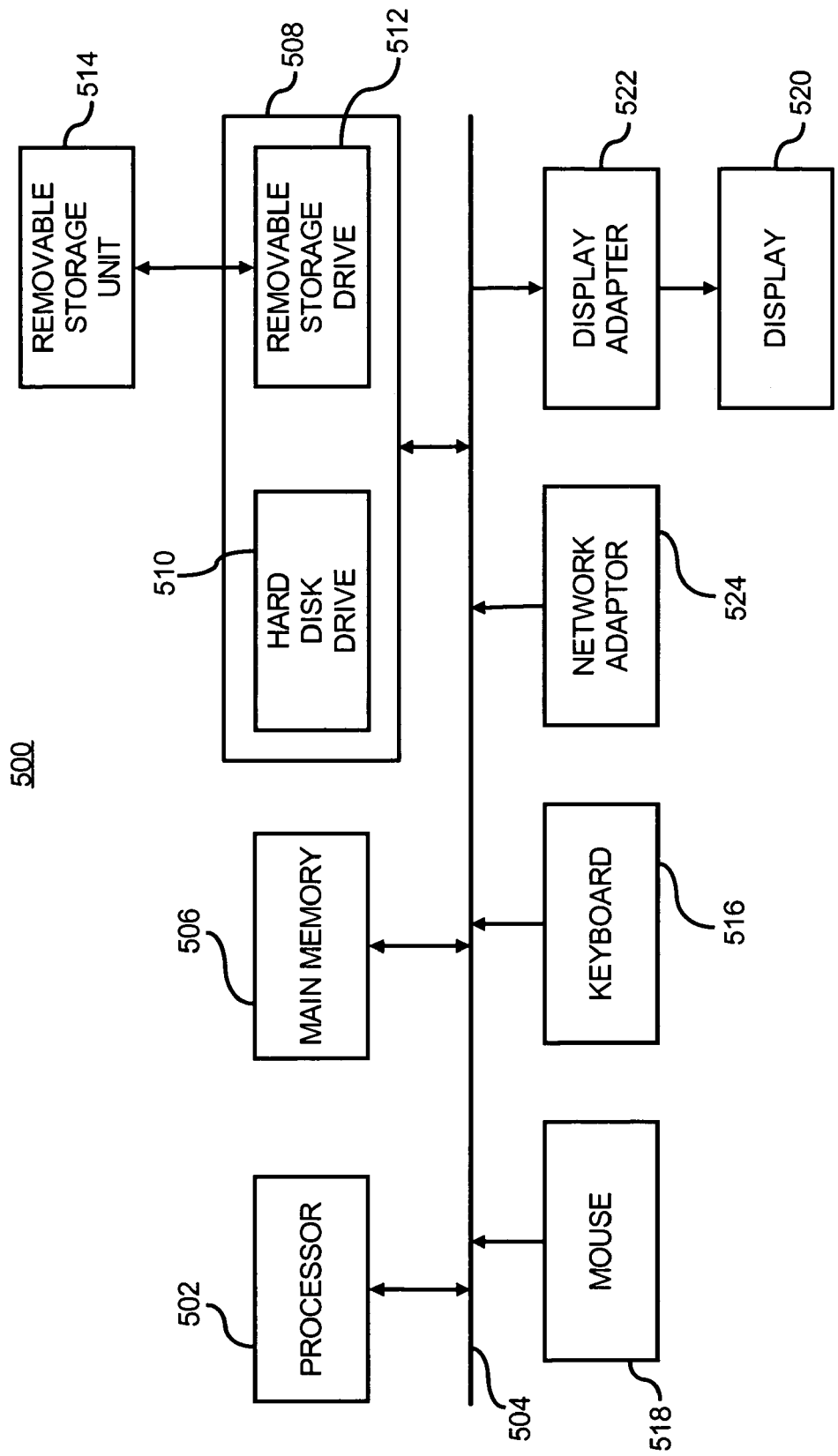
FIG. 5 illustrates a computer system, which may be employed to perform various functions described herein, according to an embodiment of the invention.

FIG. 5 illustrates a computer system 500, which may be employed to perform the various functions of the controller 130 described hereinabove, according to an embodiment. In this respect, the computer system 500 may be used as a platform for executing one or more of the functions described hereinabove with respect to the controller 130.

The computer system 500 includes one or more controllers, such as a processor 502. The processor 502 may be used to execute some or all of the steps described in the methods 300, 400, and 450. Commands and data from the processor 502 are communicated over a communication bus 504. The computer system 500 also includes a main memory 506, such as a random access memory (RAM), where the program code for, for instance, the controller 130, may be executed during runtime, and a secondary memory 508. The secondary memory 508 includes, for example, one or more hard disk drives 510 and/or a removable storage drive 512, representing a floppy diskette drive, a magnetic tape drive, a compact disk drive, etc., where a copy of the program code for the airflow delivery device to air mover correlation system may be stored.

The removable storage drive 512 reads from and/or writes to a removable storage unit 514 in a well-known manner. User input and output devices may include a keyboard 516, a mouse 518, and a display 520. A display adaptor 522 may interface with the communication bus 504 and the display 520 and may receive display data from the processor 502 and convert the display data into display commands for the display 520. In addition, the processor 502 may communicate over a network, for instance, the Internet, LAN, etc., through a network adaptor 524.

It will be apparent to one of ordinary skill in the art that other known electronic components may be added or substituted in the computer system 500. In addition, the computer system 500 may include a system board or blade used in a rack in a data center, a conventional "white box" server or computing device, etc. Also, one or more of the components in FIG. 5 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method for correlating airflow delivery devices with air movers having actuators for varying flow rates of air supplied by the air movers, said method comprising:
   (a) setting the actuators of the air movers to at least one setting;
   (b) determining flow rates of air supplied through the airflow delivery devices at the at least one setting of the actuators, each airflow delivery device being served by a plurality of air movers discretely located relative to the airflow delivery device;
   (c) setting the actuator of one of the air movers to another setting;
   (d) determining flow rates of air supplied through each of the airflow delivery devices at the second setting of the actuator;
   (e) calculating coefficients that relate the flow rates of air supplied by each of the air movers to the flow rates of air supplied through each of the airflow delivery devices based upon the flow rates determined at a plurality of actuator settings using a microprocessor; and
   (f) determining a level of influence each of the air movers has over each of the airflow delivery devices based upon a correlation between the air movers and respective airflow delivery devices determined through use of the calculated coefficients.

2. The method according to claim 1, further comprising: determining flow rates of air supplied through the air movers at the plurality of settings of the actuators.

3. The method according to claim 2, wherein setting the actuators of the airflow delivery devices to at least one setting further comprises setting the actuators of the air movers to maximum outputs and wherein the steps of determining flow rates of air supplied through the airflow delivery devices and the air movers further comprise determining flow rates of air supplied through the airflow delivery devices and the air movers at the maximum outputs of the actuators.

4. The method according to claim 3, further comprising:
   (g) selecting an air mover;
   (h) adjusting the actuator of the air mover to reduce the airflow supplied by the selected air mover;
   (i) determining flow rates of air supplied through the airflow delivery devices and the air movers;
   (j) calculating a first coefficient that relates the flow rate of air supplied by an air mover to the flow rate of air supplied through an airflow delivery device based upon the determined flow rates of air determined at step (i).

5. The method according to claim 4, further comprising:
   (k) repeating steps (g)-(j) for a number of iterations;
   (l) selecting another air mover following the number of iterations;
   (m) adjusting the actuator of the air mover to reduce the airflow supplied by the selected another air mover;
   (n) determining flow rates of air supplied through the airflow delivery devices and the air movers;
   (o) calculating a second coefficient that relates the flow rate of air supplied by an air mover to the flow rate of air supplied through an airflow delivery device based upon the determined flow rates of air determined at step (n).

6. The method according to claim 5, wherein each of the steps of calculating the first coefficient and the second coefficient further comprises calculating coefficients ($\alpha_{ji}$) for each of the airflow delivery devices (j) according to the following equation:

$$\alpha_{ji} = \frac{\dot{V}_j}{\sum_{i=1}^{n} (\dot{Q}_i)},$$

wherein $\dot{V}_j$ is the flow rate from airflow delivery device (j) and $\dot{Q}_i$ is the flow rate of air mover (i).

7. The method according to claim 6, further comprising:
   calculating an average coefficient ($\alpha_{Average}$) based upon the calculated coefficients ($\alpha$) for the airflow delivery devices (j).

8. The method according to claim 7, wherein the step of correlating the airflow delivery devices further comprises correlating the airflow delivery devices (j) to the air movers (i) according to the following equation:

$$\dot{V}_j = \alpha_{Average}[\dot{Q}_1 + \dot{Q}_2 + \ldots + \dot{Q}_n] = \alpha_{Average} \sum_{i=1}^{n} (\dot{Q}_i).$$

9. The method according to claim 1, further comprising:
   performing a pre-commissioning procedure prior to performing steps (a)-(f), said pre-commissioning procedure being performed to substantially insure that the air mover actuator settings remain constant during performance of steps (a)-(f).

10. The method according to claim 9, wherein the step of performing a pre-commissioning procedure further comprises developing correlations between a total flow rate of airflow supplied by the air movers at the air mover actuator settings.

11. The method according to claim 10, wherein the step of developing correlations further comprises developing correlations based upon flow rate measurements made at various air mover actuator settings.

12. A tangible computer readable storage medium on which is embedded one or more computer programs, said one or more computer programs implementing a method for correlating airflow delivery devices with air movers having actuators for varying flow rates of air supplied by the air movers, said one or more computer programs comprising a set of instructions for:
   setting the actuators of the air movers to at least one setting;
   determining flow rates of air supplied through the airflow delivery devices at the at least one setting of the actuators each airflow delivery device being served by a plurality of air movers discretely located relative to the airflow delivery device;

setting the actuator of one of the air movers to another setting;

determining flow rates of air supplied through each of the airflow delivery devices at the second setting of the actuator;

calculating coefficients that relate the flow rates of air supplied by each of the air movers to the flow rates of airflow supplied through each of the airflow delivery devices at a plurality of settings of the air mover actuators; and determining a level of influence each of the air movers has over each of the airflow delivery devices based upon a correlation between the air movers and respective airflow delivery devices through use of the calculated coefficients.

13. A method for correlating airflow delivery devices with air movers having actuators for varying flow rates of air supplied by the air movers, said method comprising:

(a) determining flow rates of air supplied through each of the airflow delivery devices at a plurality of settings of the actuators each airflow delivery device being served by a plurality of air movers discretely located relative to the airflow delivery device;

(b) calculating coefficients that relate the flow rates of air supplied by each of the air movers to the flow rates of air supplied through each of the airflow delivery devices based upon the flow rates determined at the plurality of actuator settings using a microprocessor, wherein the coefficients ($\alpha_{ji}$) for each of the airflow delivery devices (j) is calculated according to the following equation:

$$\alpha_{ji} = \frac{\dot{V}_j}{\sum_{i=1}^{n}(\dot{Q}_i)},$$

wherein $\dot{V}_j$ is the flow rate from airflow delivery device (j) and $\dot{Q}_i$ is the flow rate of air mover (i); and (c) correlating the airflow delivery devices with the air movers using the calculated coefficients.

14. The method according to claim 13, further comprising: calculating an average coefficient ($\alpha_{Average}$) based upon the calculated coefficients ($\alpha$) for the airflow delivery devices (j).

15. The method according to claim 14, wherein the step of correlating the airflow delivery devices further comprises correlating the airflow delivery devices (j) to the air movers (i) according to the following equation:

$$\dot{V}_j = \alpha_{Average}[\dot{Q}_1 + \dot{Q}_2 + \ldots + \dot{Q}_n] = \alpha_{Average}\sum_{i=1}^{n}(\dot{Q}_i).$$

* * * * *

UNITED STATES PATENT AND TRADEMARK OFFICE
CERTIFICATE OF CORRECTION

PATENT NO. : 7,682,234 B1  
APPLICATION NO. : 11/264793  
DATED : March 23, 2010  
INVENTOR(S) : Abdlmonem Beitelmal et al.

Page 1 of 1

It is certified that error appears in the above-identified patent and that said Letters Patent is hereby corrected as shown below:

In column 16, line 67, in Claim 12, after "actuators" insert -- , --.

In column 17, line 24, in Claim 13, after "actuators" insert -- , --.

Signed and Sealed this  
Twenty-eighth Day of December, 2010

David J. Kappos  
*Director of the United States Patent and Trademark Office*